United States Patent
Pan

(10) Patent No.: US 11,143,924 B2
(45) Date of Patent: Oct. 12, 2021

(54) MANUFACTURING METHOD OF LIQUID CRYSTAL DISPLAY AND LIQUID CRYSTAL DISPLAY

(71) Applicant: Wuhan China Star Optoelectronics Technology Co., Ltd., Wuhan (CN)

(72) Inventor: Hailong Pan, Wuhan (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 388 days.

(21) Appl. No.: 16/308,485

(22) PCT Filed: Sep. 27, 2018

(86) PCT No.: PCT/CN2018/108098
§ 371 (c)(1),
(2) Date: Dec. 10, 2018

(87) PCT Pub. No.: WO2020/019494
PCT Pub. Date: Jan. 30, 2020

(65) Prior Publication Data
US 2021/0124202 A1 Apr. 29, 2021

(30) Foreign Application Priority Data
Jul. 24, 2018 (CN) .......................... 201810821664.2

(51) Int. Cl.
*G02F 1/1345* (2006.01)
*G02F 1/1362* (2006.01)

(52) U.S. Cl.
CPC ...... *G02F 1/13452* (2013.01); *G02F 1/13454* (2013.01); *G02F 1/136227* (2013.01)

(58) Field of Classification Search
CPC ............ G02F 1/13452; G02F 1/13454; G02F 1/136227
See application file for complete search history.

(56) References Cited

U.S. PATENT DOCUMENTS

| | | | |
|---|---|---|---|
| 9,419,065 B2 * | 8/2016 | Degner | H05K 1/028 |
| 2014/0063393 A1 * | 3/2014 | Zhong | H01L 27/3258 |
| | | | 349/42 |
| 2019/0094641 A1 * | 3/2019 | Choi | G02F 1/133305 |

FOREIGN PATENT DOCUMENTS

| | | |
|---|---|---|
| CN | 104904327 A | 9/2015 |
| CN | 105223747 A | 1/2016 |
| CN | 106896599 A | 6/2017 |
| CN | 107193166 A | 9/2017 |
| JP | 2002040472 A | 2/2002 |

* cited by examiner

*Primary Examiner* — Dung T Nguyen
(74) *Attorney, Agent, or Firm* — Leong C. Lei

(57) ABSTRACT

Provided are a manufacturing method of a liquid crystal display and the liquid crystal display. In the manufacturing method of the liquid crystal display, a transparent flexible film is formed on an array substrate, and then, connection pins are formed on the transparent flexible film, and then, a portion of the transparent flexible film formed with the connection pins is fixed on a side of the array substrate away from an opposite substrate by bending, which can reduce a frame width of a liquid crystal display panel to achieve a narrow frame display.

5 Claims, 7 Drawing Sheets

MANUFACTURING METHOD OF LIQUID CRYSTAL DISPLAY AND LIQUID CRYSTAL DISPLAY

FIELD OF THE INVENTION

The present invention relates to a display technology field, and more particularly to a manufacturing method of a liquid crystal display and the liquid crystal display.

BACKGROUND OF THE INVENTION

With the development of display technology, the flat panel device, such as Liquid Crystal Display (LCD) possesses advantages of high image quality, power saving, thin body and wide application scope. Thus, it has been widely applied in various consumer electrical products, such as mobile phone, television, personal digital assistant, digital camera, notebook, laptop, and becomes the major display device.

The liquid crystal display panel of the prior art generally includes a CF (Color Filter) substrate, a TFT (Thin Film Transistor) array substrate, LC (Liquid Crystal) sandwiched between the CF substrate and TFT substrate and sealant. The working principle is that the light of backlight module is reflected to generate images by applying driving voltages to the two glass substrate for controlling the rotations of the liquid crystal molecules.

Generally, the voltages and control signals required for driving the pixels of the liquid crystal display panel are from an external flexible circuit board, and are transferred from the flexible circuit board to the liquid crystal display panel through a chip on film (COF). The liquid crystal display includes a liquid crystal display panel and a flexible circuit board. The array substrate of the liquid crystal display panel is provided with a plurality of connection pins, and the flexible circuit board is provided with a chip on film packaged with a driving chip. By bonding the output pins of the chip on film to the connection pins, the voltages and control signals generated by the driving chip are inputted into the pixels of the liquid crystal display panel to realize image display.

Further, with the continuous development of liquid crystal display technology, users have higher and higher requirements on the width of the frame of the liquid crystal display panel, and the high screen occupation ratio and the full screen display have become hot pursuits of technology. However, in the conventional liquid crystal display, the connection pins for COF bonding are disposed on the array substrate, and for this purpose, a bonding region which cannot be used for display must be reserved at the edge of the array substrate to make connection pins, which causes the frame of the LCD panel to be further reduced, and does not allow for a narrow frame display or a frameless display.

SUMMARY OF THE INVENTION

An objective of the present invention is to provide a manufacturing method of a liquid crystal display device, which can reduce a frame width of a liquid crystal display panel to achieve a narrow frame display.

Another objective of the present invention is to provide a liquid crystal display device, which can reduce a frame width of a liquid crystal display panel to achieve a narrow frame display.

For realizing the aforesaid objectives, the present invention provides a manufacturing method of a liquid crystal display, comprising steps of:

Step S1, providing an array substrate, wherein the array substrate comprises a substrate and a driving circuit on the substrate;

Step S2, forming a transparent flexible film on the array substrate, wherein the transparent flexible film comprises a first region and a second region arranged in sequence;

Step S3, selecting a portion of the second region as a bonding region, and forming a plurality of connection pins arranged at intervals on the transparent flexible film, wherein one end of the connection pin is located in the bonding region, and an other end of the connection pin extends to the first region to be electrically connected to the driving circuit;

Step S4, providing an opposite substrate, and assembling the opposite substrate and the array substrate for forming a cell, and providing a liquid crystal layer between the opposite substrate and the array substrate;

Step S5, removing a portion of the array substrate and a portion of the opposite substrate corresponding to the second region;

Step S6, removing a portion of the second region of the transparent flexible film except the bonding region;

Step S7, providing a flexible circuit board to be bonded to the connection pins; and Step S8, bending the bonding region and the flexible circuit board to be fixed to a side of the array substrate away from the opposite substrate to obtain the liquid crystal display device.

A material of the transparent flexible film is polyimide.

A plurality of via holes are formed on the transparent flexible film, and the other end of the connection pin is electrically connected to the driving circuit through the via hole.

The flexible circuit board is provided with a chip on film, and in Step S7, the chip on film on the flexible circuit board is bonded to the connection pin.

A material of the connection pin is indium tin oxide.

The present invention further provides a liquid crystal display, comprising an array substrate and an opposite substrate disposed opposite to each other, a liquid crystal layer between the array substrate and the opposite substrate, a transparent flexible film disposed on a side of the array substrate close to the opposite substrate, a plurality of connection pins arranged at intervals on the transparent flexible film and a flexible circuit board bonded to the plurality of connection pins;

wherein the array substrate comprises a substrate and a driving circuit on the substrate, and the transparent flexible film comprises a first region covering the array substrate and a bonding region connected to the first region and beyond an edge of the array substrate, and one end of the connection pin is located in the bonding region, and an other end of the connection pin extends to the first region to be electrically connected to the driving circuit; the bonding region and the flexible circuit board are bended and fixed to a side of the array substrate away from the opposite substrate.

A material of the transparent flexible film is polyimide.

A plurality of via holes are formed on the transparent flexible film, and the other end of the connection pin is electrically connected to the driving circuit through the via hole.

The flexible circuit board is provided with a chip on film, and the chip on film on the flexible circuit board is bonded to the connection pins.

A material of the connection pin is indium tin oxide.

The benefits of the present invention are: the present invention provides a manufacturing method of a liquid crystal display, and in the manufacturing method of the liquid crystal display, a transparent flexible film is formed on an array substrate, and then, connection pins are formed on the transparent flexible film, and then, a portion of the transparent flexible film formed with the connection pins is fixed on a side of the array substrate away from an opposite substrate by bending, which can reduce a frame width of a liquid crystal display panel to achieve a narrow frame display. Another objective of the present invention is to provide a liquid crystal display device, which can reduce a frame width of a liquid crystal display panel to achieve a narrow frame display.

BRIEF DESCRIPTION OF THE DRAWINGS

In order to better understand the characteristics and technical aspect of the invention, please refer to the following detailed description and accompanying drawings of the present invention. However, the drawings are provided for reference only and are not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
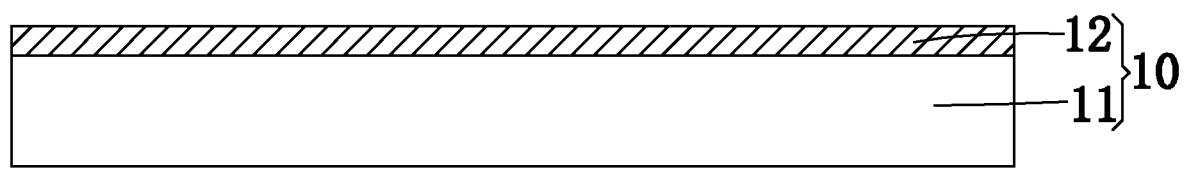
FIG. 1 is a side view diagram of Step S1 of a manufacturing method of a liquid crystal display of the present invention.
Figure 10:
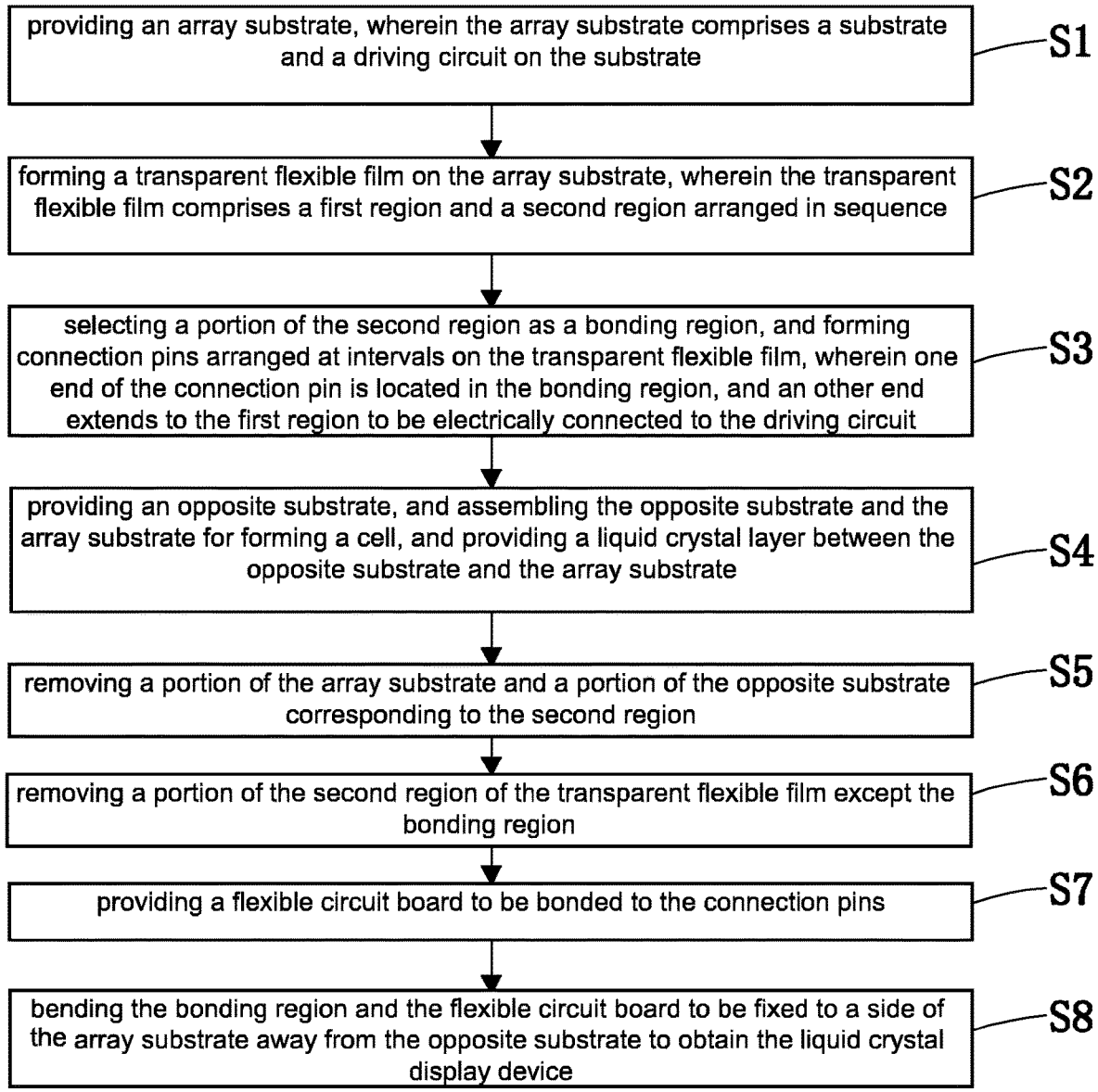
FIG. 10 is a flowchart of a manufacturing method of a liquid crystal display of the present invention.

Please refer to FIG. 10. The present invention provides a manufacturing method of a liquid crystal display, comprising steps of:

Step S1, referring to FIG. 1, providing an array substrate 10, wherein the array substrate 10 comprises a substrate 11 and a driving circuit 12 on the substrate 11.

Specifically, the substrate 11 is a rigid transparent substrate, and preferably is a glass substrate. The driving circuit includes: a thin film transistor (TFT) array, data lines and scan lines electrically connected to the TFT array, fan-out lines electrically connected to the scan lines and the data lines, and pixel electrodes electrically connected to the TFT array.

Figure 2:
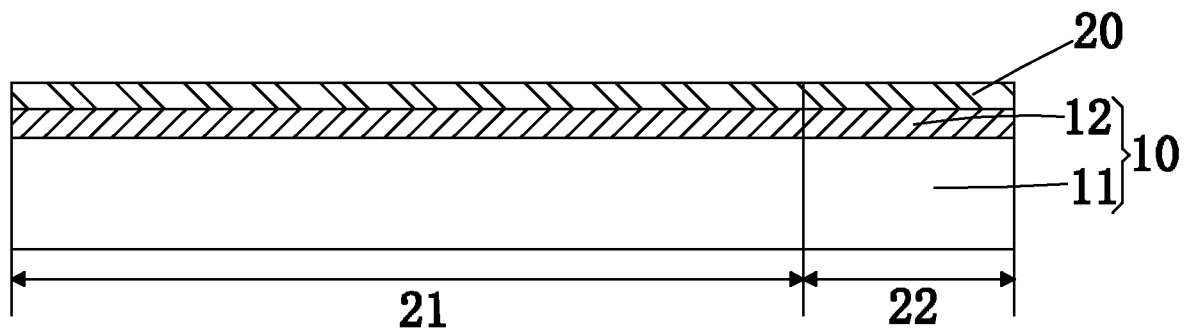
FIG. 2 is a side view diagram of Step S2 of a manufacturing method of a liquid crystal display of the present invention.

Step S2, referring to FIG. 2, forming a transparent flexible film 20 on the array substrate 10, wherein the transparent flexible film 20 comprises a first region 21 and a second region 22 arranged in sequence.

Specifically, a material of the transparent flexible film 20 is polyimide (PI). The first region 21 mainly covers a portion of the array substrate 10 for displaying images, and the second region 22 mainly covers a portion of the array substrate 10 not for displaying images.

Figure 3:
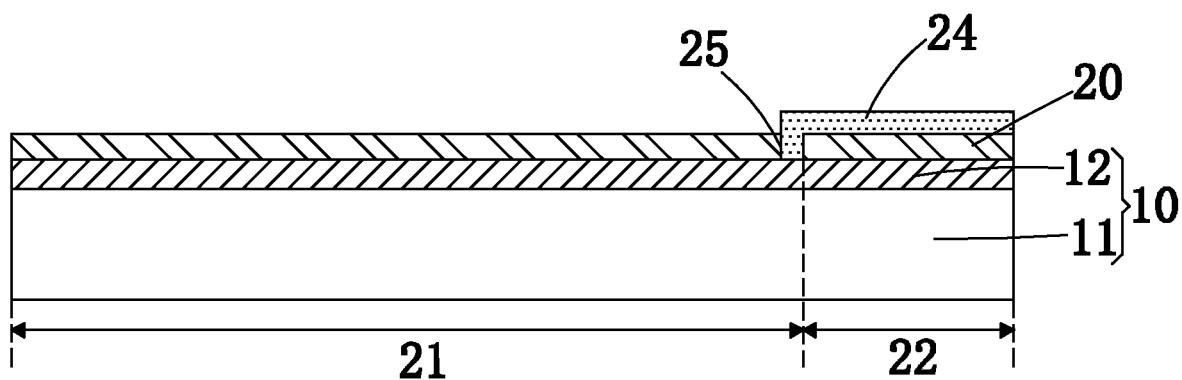
FIG. 3 is a side view diagram of Step S3 of a manufacturing method of a liquid crystal display of the present invention.
Figure 4:
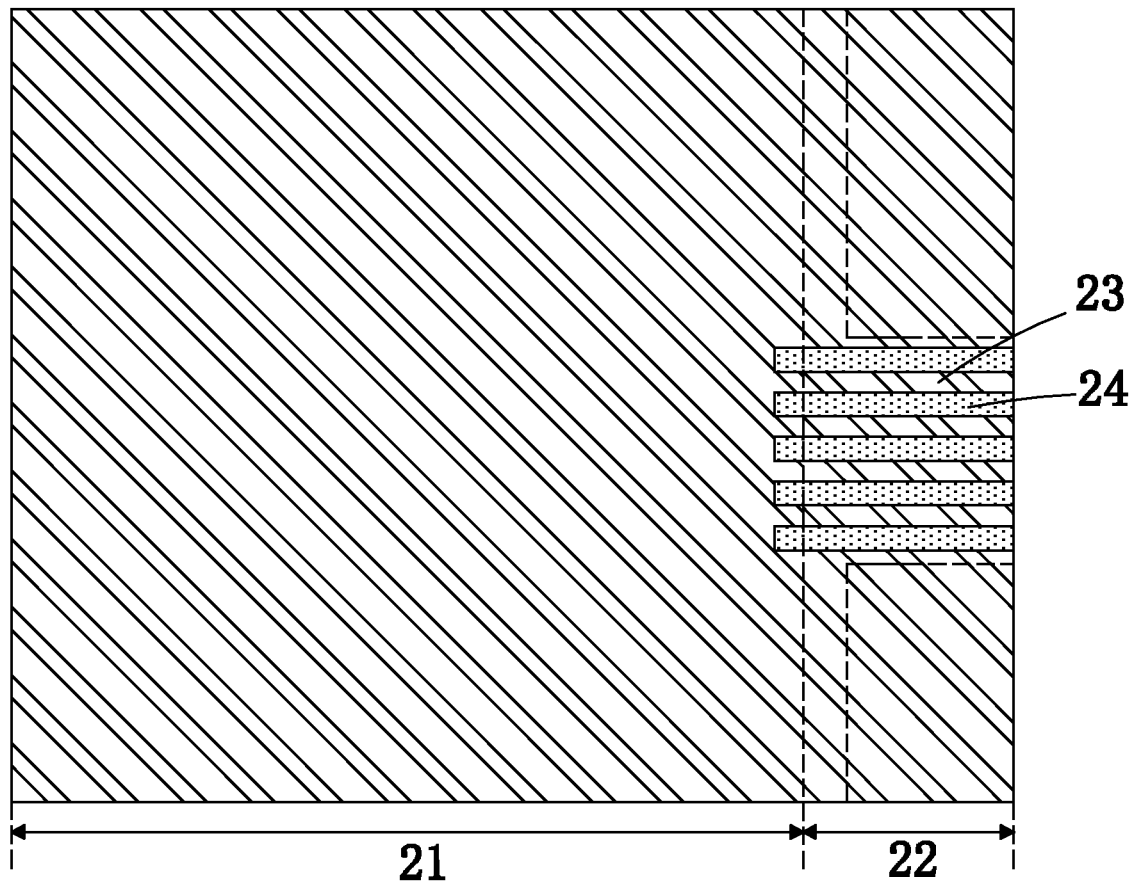
FIG. 4 is a top view diagram of Step S3 of a manufacturing method of a liquid crystal display of the present invention.

Step S3, referring to FIG. 3 and FIG. 4, selecting a portion of the second region 22 as a bonding region 23, and forming a plurality of connection pins 24 arranged at intervals on the transparent flexible film 20, wherein one end of the connection pin 24 is located in the bonding region 23, and an other end of the connection pin extends to the first region 21 to be electrically connected to the driving circuit 12.

Specifically, a plurality of via holes 25 are formed on the transparent flexible film 20, and the other end of the connection pin 24 is electrically connected to the driving circuit 12 through the via hole 25. Furthermore, the connection pin 24 is electrically connected to the fan-out line.

Preferably, a material of the connection pin 24 is indium tin oxide.

Figure 5:
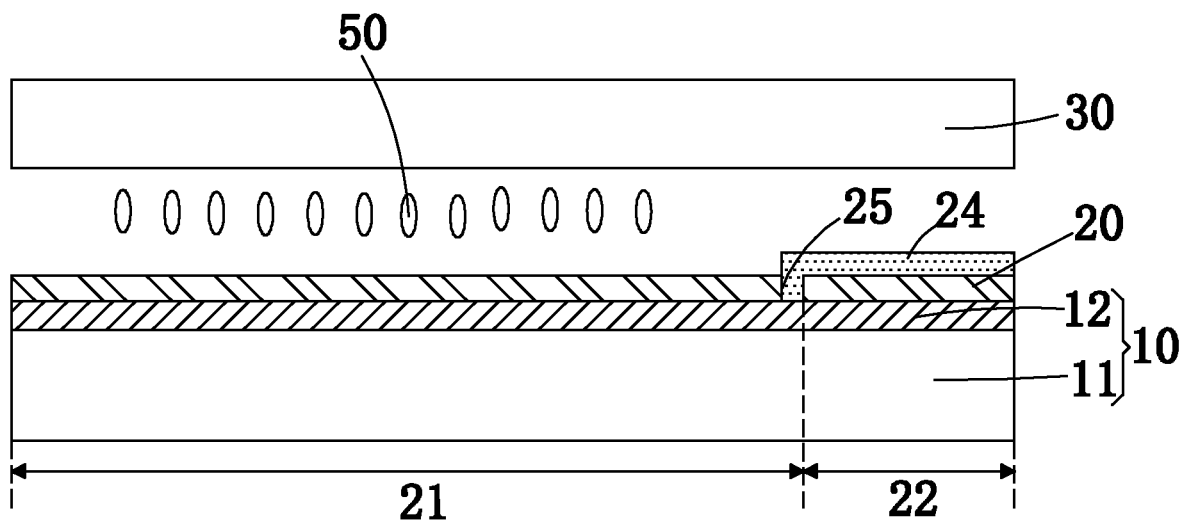
FIG. 5 is a side view diagram of Step S4 of a manufacturing method of a liquid crystal display of the present invention.

Step S4, referring to FIG. 5, providing an opposite substrate 30, and assembling the opposite substrate 30 and the array substrate 10 for forming a cell, and providing a liquid crystal layer 50 between the opposite substrate 30 and the array substrate 10.

Specifically, the opposite substrate 30 is provided with a color filter, a black matrix and a common electrode. Certainly, the opposite substrate 30 may not be provided with a color filter and a black matrix as needed, and the color filter and the black matrix may be disposed on the array substrate 10, which do not affect the implementation of the present invention.

Figure 6:
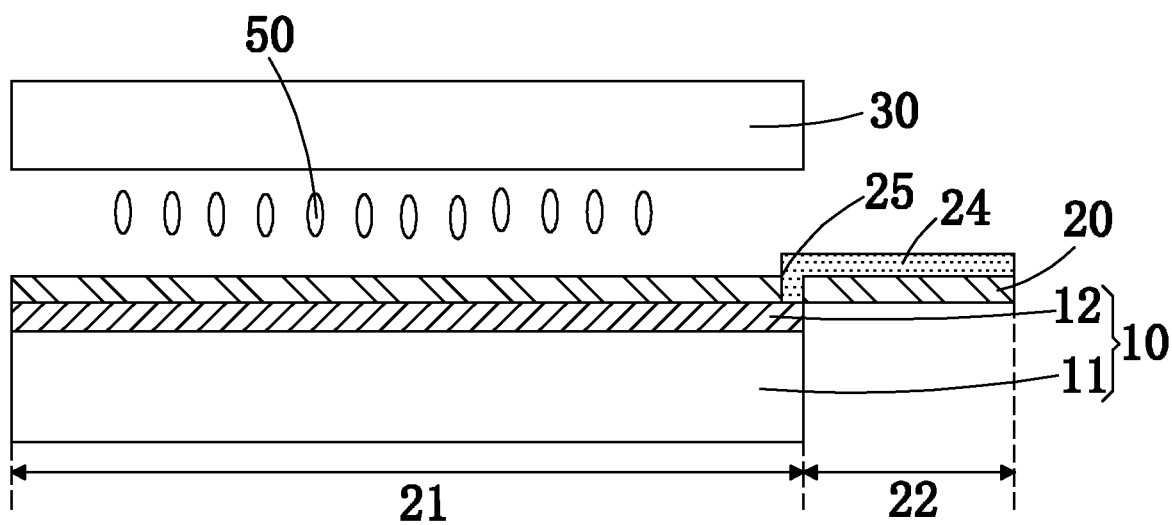
FIG. 6 is a side view diagram of Step S5 of a manufacturing method of a liquid crystal display of the present invention.

Step S5, referring to FIG. 6, removing a portion of the array substrate 10 and a portion of the opposite substrate 30 corresponding to the second region 22.

Specifically, in Step S5, the portion of the array substrate 10 and the portion of the opposite substrate 30 corresponding to the second region 22 are removed by a cutting process.

Figure 7:
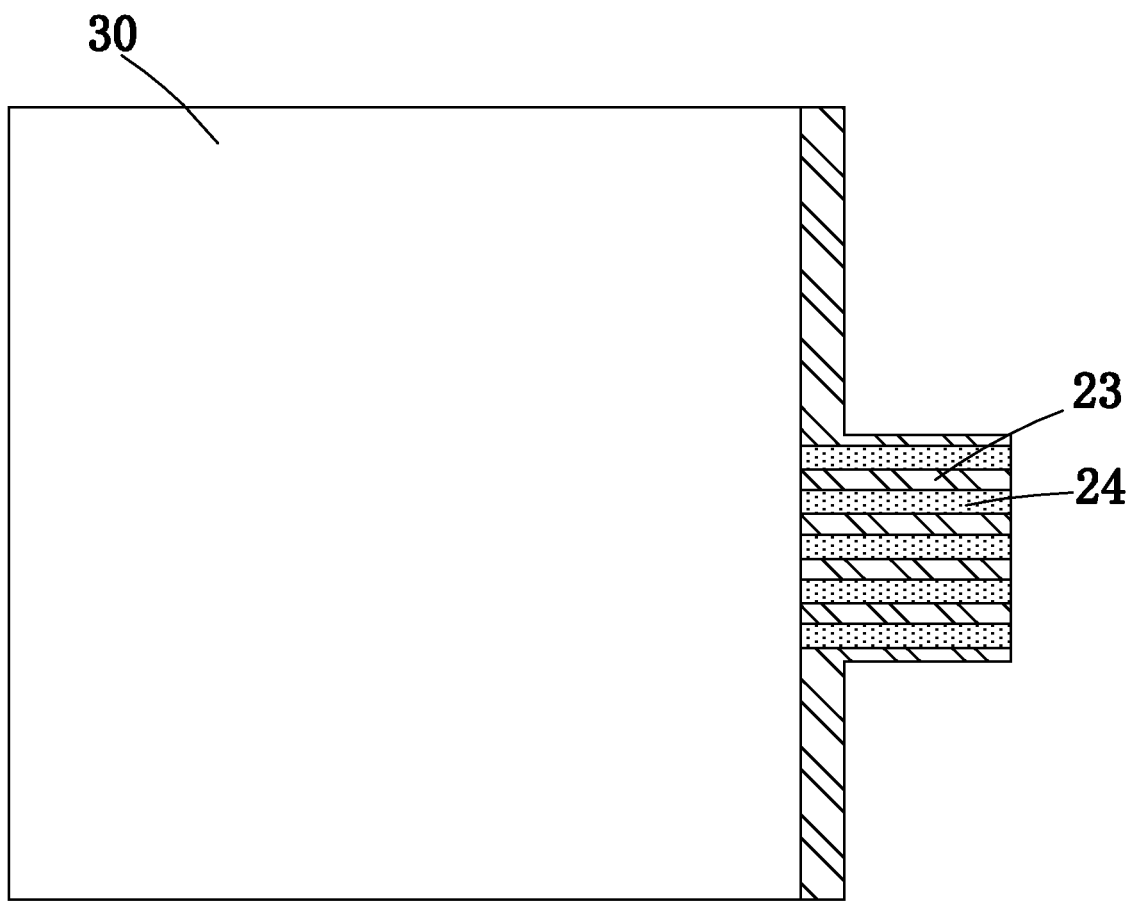
FIG. 7 is a top view diagram of Step S6 of a manufacturing method of a liquid crystal display of the present invention.

Step S6, referring to FIG. 7, removing a portion of the second region 22 of the transparent flexible film 20 except the bonding region 23.

Specifically, in Step S6, the portion of the second region 22 of the transparent flexible film 20 except the bonding region 23 is removed by a cutting process.

Preferably, a shape of the bonding region 23 after cutting is a convex shape.

Figure 8:
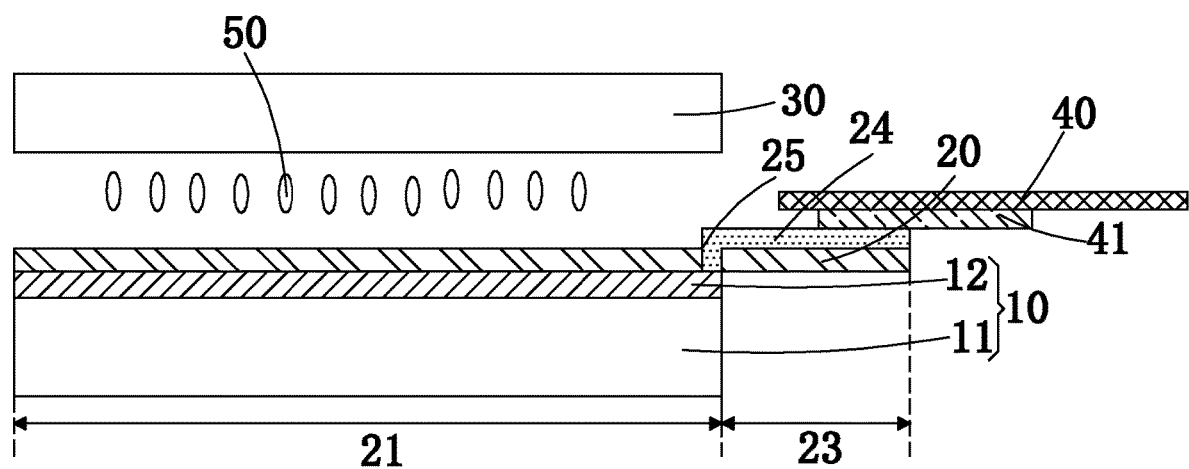
FIG. 8 is a side view diagram of Step S7 of a manufacturing method of a liquid crystal display of the present invention.

Step S7, referring to FIG. 8, providing a flexible circuit board 40 and bonding the flexible circuit board 40 to the connection pins 24.

Specifically, the flexible circuit board 40 is provided with a chip on film 41, and in Step S7, the chip on film 41 on the flexible circuit board 40 is bonded to the connection pin 24.

Further, a driving chip is packaged in the chip on film 41, and the driving chip provides control signals and voltages required for display on the liquid crystal display panel.

Further, the chip on film 41 is provided with output pins. The chip on film 41 and the connection pin 24 are bonded together by pressing the output pins together with the connection pins in a one-to-one correspondence.

Figure 9:
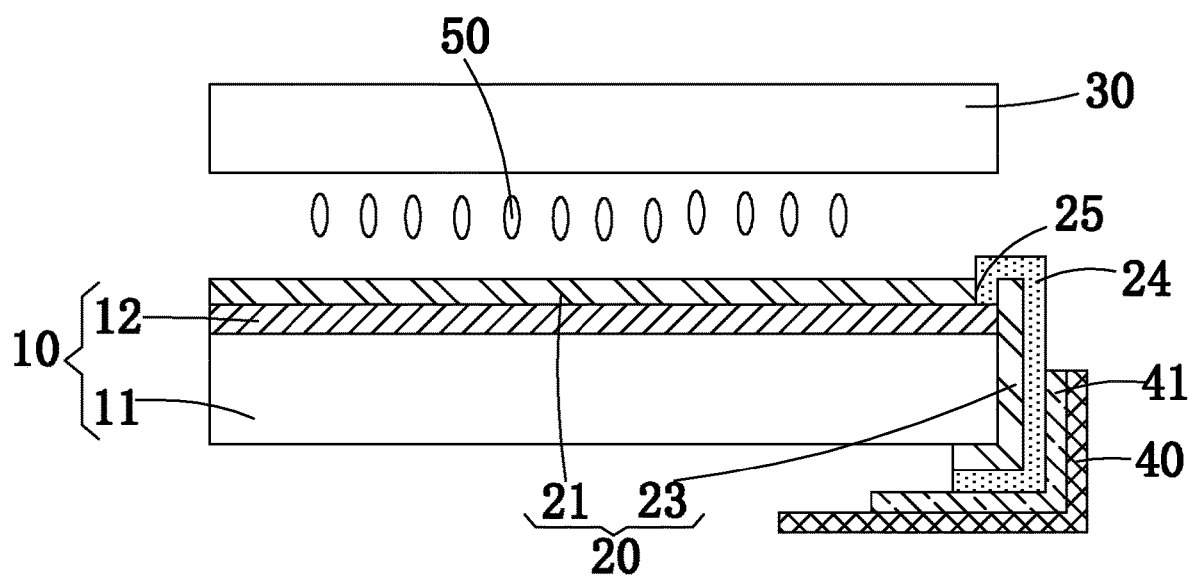
FIG. 9 is a side view diagram of Step S8 of a manufacturing method of a liquid crystal display of the present invention, and a diagram of a liquid crystal display of the present invention.

Step S8, referring to FIG. 9, bending the bonding region 23 and the flexible circuit board 40 to be fixed to a side of the array substrate 10 away from the opposite substrate 30 to obtain the liquid crystal display device.

Specifically, by bending in Step S8, the region where the connection pins 24 are formed is bent to the side of the array substrate 10 away from the opposite substrate 30. In comparison with the prior art, there is no need to reserve a bonding region for making the connection pins 24 on the array substrate. The frame of the liquid crystal display can be reduced to achieve a narrow frame display.

Please refer to FIG. 9. The present invention provides a liquid crystal display, comprising: an array substrate 10 and an opposite substrate 30 disposed opposite to each other, a liquid crystal layer 50 between the array substrate 10 and the opposite substrate 30, a transparent flexible film 20 disposed on a side of the array substrate 10 close to the opposite substrate 30, a plurality of connection pins 24 arranged at intervals on the transparent flexible film 20 and a flexible circuit board 40 bonded to the plurality of connection pins 24;

wherein the array substrate 10 comprises a substrate 11 and a driving circuit 12 on the substrate 11, and the transparent flexible film 20 comprises a first region 21 covering the array substrate 10 and a bonding region 23 connected to the first region 21 and beyond an edge of the array substrate 10, and one end of the connection pin 24 is located in the bonding region 23, and an other end of the connection pin 24 extends to the first region 21 to be electrically connected to the driving circuit 12; the bonding region 23 and the flexible circuit board 40 are bended and fixed to a side of the array substrate 10 away from the opposite substrate 30.

Specifically, the substrate 11 is a rigid transparent substrate, and preferably is a glass substrate. The driving circuit includes: a thin film transistor (TFT) array, data lines and scan lines electrically connected to the TFT array, fan-out lines electrically connected to the scan lines and the data lines, and pixel electrodes electrically connected to the TFT array.

Specifically, a material of the transparent flexible film 20 is polyimide (PI). The first region 21 mainly covers a portion of the array substrate 10 for displaying images, and the second region 22 mainly covers a portion of the array substrate 10 not for displaying images.

Specifically, a plurality of via holes 25 are formed on the transparent flexible film 20, and the other end of the connection pin 24 is electrically connected to the driving circuit 12 through the via hole 25. Furthermore, the connection pin 24 is electrically connected to the fan-out line.

Preferably, a material of the connection pin 24 is indium tin oxide.

Preferably, a shape of the bonding region 23 is a convex shape.

Specifically, the flexible circuit board 40 is provided with a chip on film 41, and in Step S7, the chip on film 41 on the flexible circuit board 40 is bonded to the connection pin 24.

Further, a driving chip is packaged in the chip on film 41, and the driving chip provides control signals and voltages required for display on the liquid crystal display panel.

Further, the chip on film 41 is provided with output pins. The chip on film 41 and the connection pin 24 are bonded together by pressing the output pins together with the connection pins in a one-to-one correspondence.

Specifically, by forming the connection pins 41 on the transparent flexible film 20 and bending, the region where the connection pins 24 are formed is bent to the side of the array substrate 10 away from the opposite substrate 30. In comparison with the prior art, there is no need to reserve a bonding region for making the connection pins 24 on the array substrate. The frame of the liquid crystal display can be reduced to achieve a narrow frame display.

In conclusion, the present invention provides a manufacturing method of a liquid crystal display, and in the manufacturing method of the liquid crystal display, a transparent flexible film is formed on an array substrate, and then, connection pins are formed on the transparent flexible film, and then, a portion of the transparent flexible film formed with the connection pins is fixed on a side of the array substrate away from an opposite substrate by bending, which can reduce a frame width of a liquid crystal display panel to achieve a narrow frame display. The present invention further provides a liquid crystal display device, which can reduce a frame width of a liquid crystal display panel to achieve a narrow frame display.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacturing method of a liquid crystal display, comprising steps of:

Step S1, providing an array substrate, wherein the array substrate comprises a substrate and a driving circuit on the substrate;

Step S2, forming a transparent flexible film on the array substrate, wherein the transparent flexible film comprises a first region and a second region arranged in sequence;

Step S3, selecting a portion of the second region as a bonding region, and forming a plurality of connection pins arranged at intervals on the transparent flexible film, wherein one end of each of the connection pins is located in the bonding region, and an other end of each of the connection pins extends to the first region to be electrically connected to the driving circuit;

Step S4, providing an opposite substrate, and assembling the opposite substrate and the array substrate for forming a cell, and providing a liquid crystal layer between the opposite substrate and the array substrate;

Step S5, removing a portion of the array substrate corresponding to the second region of the transparent flexible film and removing a portion of the opposite substrate corresponding to the second region of the transparent flexible film such that the bonding region of the transparent flexible film is beyond an edge of the array substrate;

Step S6, removing a portion of the second region of the transparent flexible film except the bonding region;

Step S7, providing a flexible circuit board to be bonded to the connection pins on the transparent flexible film; and Step S8, bending the one ends of the connection pins in the bonding region of the transparent flexible film and the flexible circuit board to be fixed to a side of the array substrate away from the opposite substrate to obtain the liquid crystal display device.

2. The manufacturing method of the liquid crystal display according to claim 1, wherein a material of the transparent flexible film is polyimide.

3. The manufacturing method of the liquid crystal display according to claim 1, wherein a plurality of via holes are formed in the transparent flexible film, and the other end of each of the connection pins is electrically connected to the driving circuit through the via holes.

4. The manufacturing method of the liquid crystal display according to claim 1, wherein the flexible circuit board is provided with a chip on film, and in Step S7, the chip on film on the flexible circuit board is bonded to the connection pins.

5. The manufacturing method of the liquid crystal display according to claim 1, wherein a material of the connection pins is indium tin oxide.

* * * * *